US007458054B2

(12) United States Patent
Hara

(10) Patent No.: US 7,458,054 B2
(45) Date of Patent: Nov. 25, 2008

(54) METHOD FOR DESIGNING INTEGRATED CIRCUIT PACKAGE AND METHOD FOR MANUFACTURING SAME

(75) Inventor: Shinji Hara, Nara (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 311 days.

(21) Appl. No.: 11/329,176

(22) Filed: Jan. 11, 2006

(65) Prior Publication Data

US 2006/0161873 A1 Jul. 20, 2006

(30) Foreign Application Priority Data

Jan. 14, 2005 (JP) .............................. 2005-007782

(51) Int. Cl.
*G07F 17/50* (2006.01)
(52) U.S. Cl. ......................................... 716/11; 257/728
(58) Field of Classification Search ...................... 716/1, 716/2, 10–11; 257/678, 684, 713, 723, 724, 257/728
See application file for complete search history.

(56) References Cited

U.S. PATENT DOCUMENTS

| 5,912,808 | A | 6/1999 | Ikemoto |
| 6,460,168 | B1 | 10/2002 | Yamamoto et al. |
| 7,289,008 | B2 * | 10/2007 | Kuroki et al. ............... 333/133 |
| 2002/0042902 | A1 | 4/2002 | Yamamoto et al. |
| 2003/0145262 | A1 | 7/2003 | Wheeler |
| 2003/0150110 | A1 | 8/2003 | Kang et al. |
| 2003/0161124 | A1 | 8/2003 | Kariyazaki |
| 2004/0168142 | A1 | 8/2004 | Ishikawa et al. |

FOREIGN PATENT DOCUMENTS

| JP | 11-68031 | 3/1999 |
| JP | 2004-356499 | 12/2004 |
| TW | 389912 B | 5/2000 |
| TW | 423708 | 2/2001 |

OTHER PUBLICATIONS

Search Report for Corresponding Taiwan Patent Application No. 095101522 and English Translation of.
"WLAN Pas", Power Amplifier Solutions for 802.11a,b,g Applications, Anadigics, Inc., Jul. 2004, "URL:http://www.anadigics.com/products/addrefs/Brochure/WLAN_Brochure_Jul. 2004)_web.pdf".

(Continued)

*Primary Examiner*—Vuthe Siek
(74) *Attorney, Agent, or Firm*—Harness, Dickey & Pierce, P.L.C.

(57) ABSTRACT

A new IC package 12 is designed as follows. That is, a circuit block 2 is omitted from an existing IC package 11 including a package 11*a* having a circuit block 1 and the circuit block 2 which are connected to a plurality of terminals including high-frequency terminals, but the position of a high-frequency terminal connected to the circuit block 1 is never changed. Carried out next is omission of a portion 6, which is associated with the circuit block 2, of the package 11*a*. This makes it possible to provide (i) a method for designing a small IC package, and (ii) a method for manufacturing the IC package. With the methods, time required for the designing and adjustment of the designing can be shortened.

9 Claims, 7 Drawing Sheets

OTHER PUBLICATIONS

RF Integrated Corp., "AP2010 2.4&5 GHz Dual Band Power Amplifier", Dec. 15, 2004, "URL:http://www.rfintc.com/pdf_file/AP2010.pdf".

RF Integrated Corp., "AP1091 2.4~2.5 GHz Power Amplifier", Mar. 27, 2003, "URL:http://www.rfintc.com/pdf_file/AP1091.pdf".

RF Integrated Corp., "AP1093 2.4~2.5 GHz Power Amplifier", Aug. 30, 2004, "URL:http://www.rfintc.com/pdf_file/AP1093.pdf".

RF Integrated Corp., "AP2085 5GHz Power Amplifier", Aug. 6, 2004, "URL:http://www.rfintc.com/pdf_file/AP2085.pdf".

Release Note No. 2002-136 (Feb. 28, 2003; Sharp Kabushiki Kaisha) "Now Available is High Gain Power Amplifier <IRM042U> Compliant with Three Wireless LAN Standards".

ASCII 24 "Sharp Provides an IEEE 802.11 a/b/g Compliant 2.4 GHz/5GHz Dual Band Power Amplifier IRM042" (http://ascii24.com/news/i/tech/article/2003/02/28/642168-000.html?c=broadband).

"Basis of Wireless Data communication and Utilization of RF Component" Edited by Transistor Technique Editorial Department, CQ Publishing. Co. Ltd., published on Dec. 1, 2003, pp. 152-166.

* cited by examiner

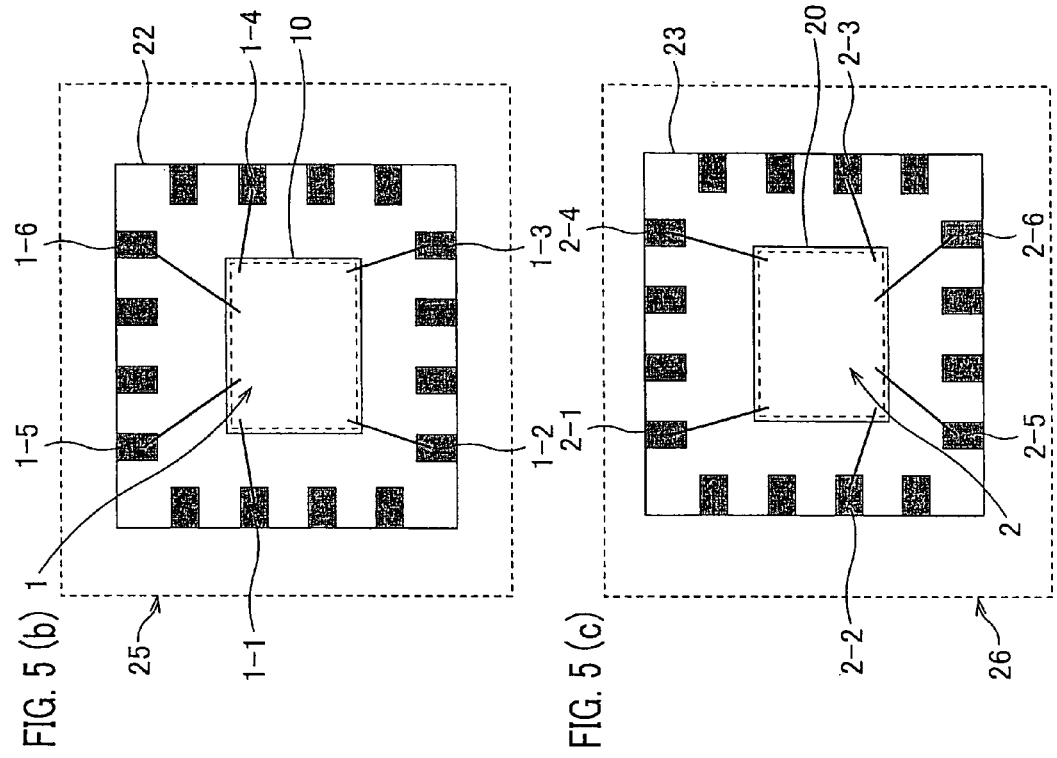
FIG. 5 (b)
FIG. 5 (c)
PRIOR ART
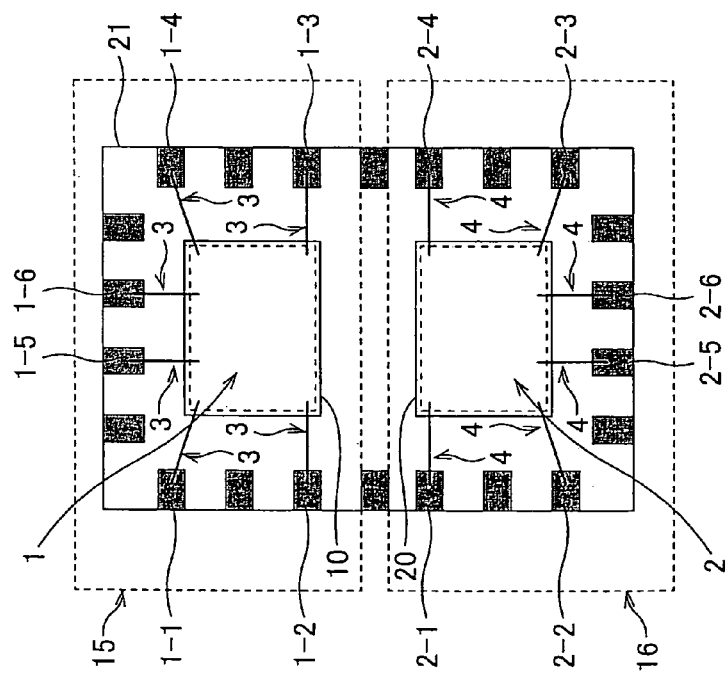
FIG. 5 (a)

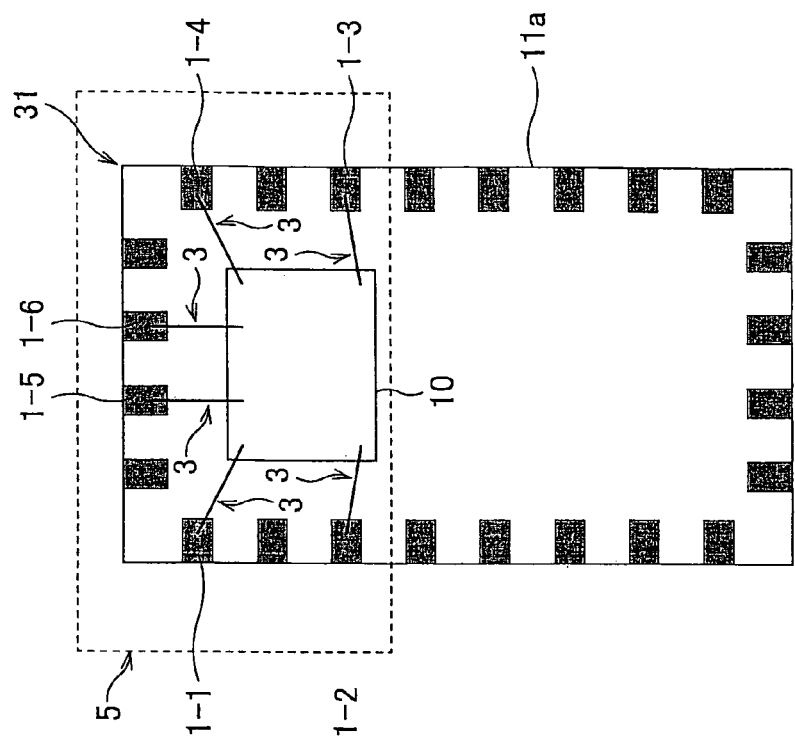
FIG. 7 (b)
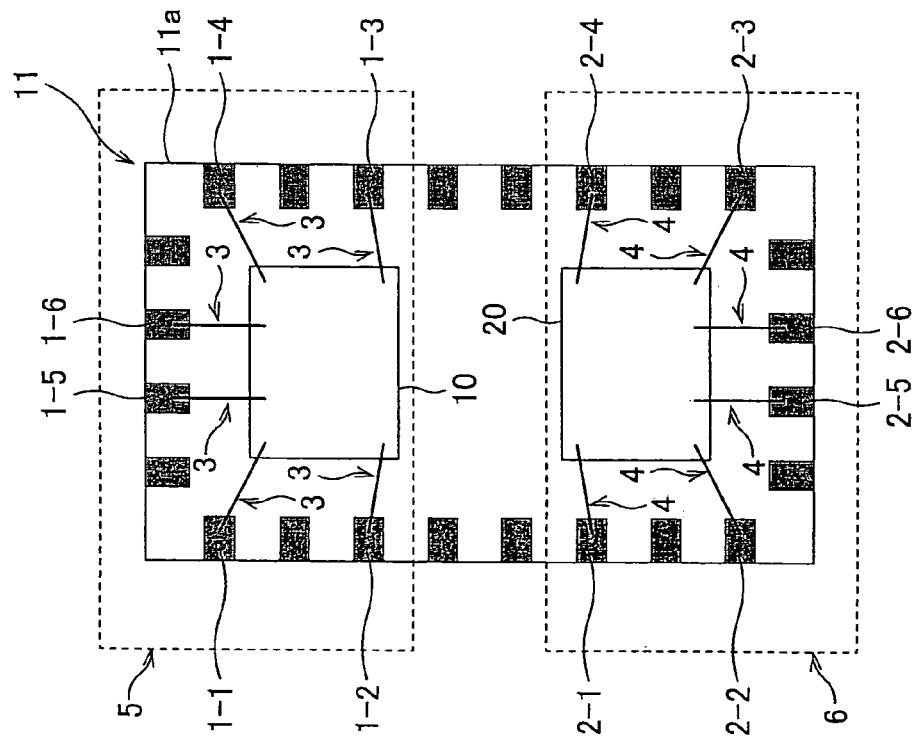
FIG. 7 (a)　PRIOR ART

FIG. 8 (a) PRIOR ART

METHOD FOR DESIGNING INTEGRATED CIRCUIT PACKAGE AND METHOD FOR MANUFACTURING SAME

This Nonprovisional application claims priority under 35 U.S.C. § 119(a) on Patent Application No. 2005/007782 filed in Japan on Jan. 14, 2005, the entire contents of which are hereby incorporated by reference.

FIELD OF THE INVENTION

The present invention relates to (i) a method for designing an integrated circuit (hereinafter, referred to as "IC") package obtained by providing an IC in a package having a plurality of terminals; and (ii) a method for manufacturing the IC package. More specifically, the present invention relates to (i) a method for designing an IC package in which a terminal layout is modified; and (ii) a method for manufacturing the IC package.

BACKGROUND OF THE INVENTION

In many cases, an IC chip is installed in a package including a plurality of terminals, in accordance with the wire bonding method. Generally, in the wire bonding method used for the installation of the IC chip in the package, an appropriate size of the package and respective positions (layout) of the terminals are determined in accordance with (i) the size of the IC chip, (ii) the number of terminals required for the installation of the IC chip, and (iii) simplicity in a wire layout.

The following explains (i) an example of a conventional method for designing, based on an IC package including a plurality of circuit blocks, an IC package using only a part of functions of the circuit blocks; and (ii) an example of a conventional method for manufacturing such an IC package. The explanation will be made with reference to FIG. 5(*a*) through FIG. 5(*c*), and FIG. 6(*a*) through FIG. 6(*c*).

FIG. 5(*a*) illustrates an IC package obtained by installing, in a package 21 by way of wires 3 and 4, (i) an IC chip 10 including a circuit block 1 and (ii) an IC chip 20 including a circuit block 2, respectively. FIG. 5(*b*) illustrates an IC package obtained by installing the IC chip 10 in a package 22 by way of the wires 3. FIG. 5(*c*) illustrates an IC package obtained by installing the IC chip 20 in a package 23 by way of the wires 4. Provided on the IC chips 10 and 20 are circuits 1 and 2, respectively. Note that, in the following explanation, the circuits 1 and 2 are referred to as "circuit blocks 1 and 2", respectively.

Now, see the conventional method of designing, based on the IC package (see FIG. 5(*a*)) including the circuit blocks 1 and 2, an IC package merely using either the circuit block 1 or the circuit block 2. In this case, the designing is carried out as follows for the sake of cost reduction. That is, firstly carried out is designing of either (i) the new package 22 having a size and a terminal (pin) layout which are appropriate for the IC chip 10 only including the circuit block 1; or (ii) the new package 23 having a size and a terminal (pin) layout which are appropriate for the IC chip 20 only including the circuit block 2. Then, the package 22 or 23 is manufactured in accordance with the design. Thereafter, the IC chip 10 or 20 each used for the manufacturing of the IC package shown in FIG. 5(*a*) is installed in the package 22 or 23 thus manufactured, respectively. This makes it possible to manufacture either (i) the IC package (see FIG. 5(*b*)) including the circuit block 1 or (ii) the IC package (see FIG. 5(*c*)) including the circuit block 2.

Meanwhile, FIG. 6(*a*) illustrates an IC package obtained by installing, in a package 51 by way of the wires 3 and 4, an IC chip 8 on which the circuit blocks 1 and 2 are provided. FIG. 6(*b*) illustrates an IC package obtained by installing the IC chip 10 in the package 22 by way of the wires 3. FIG. 6(*c*) illustrates an IC package obtained by installing the IC chip 20 in the package 23 by way of the wires 4.

Now, see the conventional method of designing, based on the IC package (see FIG. 6(*a*)) including the IC chip 8 on which the circuit blocks 1 and 2 are provided, an IC package merely using either the circuit block 1 or the circuit block 2. In this case, the designing is carried out as follows for the sake of cost reduction. That is, firstly carried out is designing of either (i) the IC chip 10 only including the circuit block 1, or (ii) the IC chip 20 only including the circuit block 2. Designed next is either (i) the new package 22 having a size and a terminal (pin) layout which are appropriate for the IC chip 10 thus designed; or (ii) the new package 23 having a size and a terminal (pin) layout which are appropriate for the IC chip 20 thus designed. Then, either (i) the IC chip 10 and the package 22 or (ii) the IC chip 20 and the package 23 are manufactured (prepared) in accordance with the design. Thereafter, the IC chip 10 or 20 is installed in the package 22 or 23 thus manufactured, respectively. This makes it possible to manufacture either (i) the IC package (see FIG. 6(*b*)) including the circuit block 1 or (ii) the IC package (see FIG. 6(*c*)) including the circuit block 2.

In the conventional designing method, the package 21 of the IC package (original IC package) used as a base (hereinafter, also referred to as "design base") of the designing has a size different from the size of the package 22 or 23 of the designed IC package.

So, compare (i) the size of a region 15 of the package 21 (see FIG. 5(*a*)) of the original IC package, with (ii) a region 25 of the package 22 (see FIG. 5(*b*)) of the designed IC package. Also, compare (i) the size of a region 15' of the package 51 (see FIG. 6(*a*)) of the original IC package, with (ii) the region 25 of the package 22 (see FIG. 6(*b*)) of the designed IC package. Each of the regions 15 and 15' is associated with the circuit block 1, and has a width (lengthwise direction in the figures) different from that of the region 25 of the package 22.

In the meanwhile, described in, e.g., Non-patent document 1 are a wireless LAN use dual-band power amplifier "AWL9924" and a wireless LAN use single-band power amplifier "RFS-P2023", each of which is presumably designed in accordance with a method similar to the aforementioned conventional designing method. The dual-band power amplifier "AWL9924" is a power amplifier used in a so-called "dual-band wireless LAN system", so that the dual-band power amplifier "AWL9924" is accommodated to (i) wireless LAN (IEEE.802.11b/g) using the 2.4 GHz band and (ii) wireless LAN (IEEE.802.11a) using the 5 GHz band. As described in Non-patent document 1, the dual-band power amplifier "AWL9924" is an IC package including (i) a power amplifier for use in the wireless LAN using the 2.4 GHz band; (ii) a power amplifier for use in the wireless LAN using the 5 GHz band; and (iii) a detector. On the other hand, the single-band power amplifier "RFS-P2023" is a power amplifier used in a so-called "single-band wireless LAN system", so that the single-band power amplifier "RFS-P2023" is accommodated only to the wireless LAN (IEEE.802.11b/g) using the 2.4 GHz band. As described in Non-patent document 1, the single-band power amplifier "RFS-P2023" is an IC package including (i) a power amplifier for use in the wireless LAN using the 2.4 GHz band; and (ii) a detector. Therefore, in this example, the power amplifier used for the 2.4 GHz wireless LAN corresponds to the circuit block 1; the power amplifier used for the 5 GHz wireless LAN corresponds to the circuit block 2; the dual-band power amplifier "AWL9924" corresponds to the IC package including the circuit blocks 1 and 2; and the single-band amplifier "RFS-P2023" corresponds to the IC package including only the circuit block 1. In this example, the dual-band power amplifier "AWL9924" has a package size of 4 mm×4 mm×1 mm, and the single-band power amplifier "RFS-P2023" has a package size of 3 mm×3 mm×1 mm. Therefore, the dual-band power amplifier "AWL9924" has a package size different from that of the single-band amplifier "RFS-P2023".

Further, in the conventional designing method, the region 15 (or 15') of the package 21 (or 51) of the original IC package is generally different from the region 25 of the package 22 of the designed IC package, in terms of the terminal layout. Specifically, the region 15 (or 15') associated with the circuit block 1 is different from the region 25 associated with the circuit block 1, in terms of the respective positions of terminals 1-1 through 1-6 each connected to the circuit block 1. Similarly, a region 16 (or 16') of the package 21 (or 51) of the original IC package is generally different from a region 26 of the package 23 of the designed IC package, in terms of the terminal layout. Specifically, the region 16 associated with the circuit block 2 is different from the region 26 associated with the circuit block 2, in terms of the respective positions of terminals 2-1 through 2-6. Note that the wording "region associated with the circuit block 1" refers to a region in which the terminals 1-1 through 1-6 each connected to the circuit block 1, and terminals provided among the terminals 1-1 through 1-6 are positioned. Whereas, the wording "region associated with the circuit block 2" refers to a region in which terminals 2-1 through 2-6 connected to the circuit block 2, and terminals provided among the terminals 2-1 through 2-6 are positioned.

In the meanwhile, described in, e.g., Non-patent documents 2, 3, 4, and 5 are: a dual-band power amplifier "AP2010", 2.4 GHz single-band power amplifiers "AP1091" and "AP1093", and a 5 GHz single-band power amplifier "AP2085", each of which is presumably designed in accordance with a method similar to the aforementioned conventional designing method. In this example, the dual-band power amplifier "AP2010" corresponds to the IC package including the circuit blocks 1 and 2; each of the 2.4 GHz single-band power amplifiers "AP1091" and "AP1093" corresponds to the IC package including only the circuit block 1; and the 5 GHz single-band power amplifier "AP2085" corresponds to the IC package including the circuit block 2. In this example, the 2.4 GHz single-band power amplifiers "AP1091" and "AP1093", and the 5 GHz single-band power amplifier "AP2085" are different from the dual-band power amplifier "AP2010" in terms of the terminal layout, as described in Non-patent documents 2, 3, 4, and 5.

In the example shown in FIG. 5(a) through FIG. 5(c), compare (i) the terminal layout of the region 15 of the package 21 (see FIG. 5(a)) of the original IC package, with (ii) the terminal layout of the region 25 of the package 22 (see FIG. 5(b)) of the designed IC package. Also, in the example shown in FIG. 6(a) through FIG. 6(c), compare (i) the terminal layout of the region 15' of the package 51 (see FIG. 6(a)) of the original IC package, with (ii) the terminal layout of the region 25 of the package 22 (see FIG. 6(b)) of the designed IC package. Each of the comparisons clarifies that the terminal layouts are different from each other. Each of the regions 15, 15', and 25 is associated with the circuit block 1.

The present applicants have invented unprecedented and new designing method and manufacturing method, recently. The methods are now publicly known. In the methods, an IC package using a plurality of circuit blocks is used as a base in designing an IC package using a part of the circuit blocks; however, the IC package thus designed has the same terminal layout and size as those of the original IC package. The following explains an example of such new designing method and manufacturing method, with reference to FIG. 7(a), FIG. 7(b), FIG. 8(a), and FIG. 8(b). For ease of explanation, materials having the equivalent functions as those shown in either FIG. 5(a) through FIG. 5(c) or FIG. 6(a) through FIG. 6(c) will be given the same reference symbols, and explanation thereof will be omitted here.

FIG. 7(a) illustrates an IC package 11 obtained by installing, in a package 11a by way of the wires 3 and 4, (i) the IC chip 10 on which the circuit block 1 is provided and (ii) the IC chip 20 on which the circuit block 2 is provided. FIG. 7(b) illustrates an IC package 31 obtained by installing the IC chip 10 in the IC package 11 by way of the wires 3.

In the designing method, when the new IC package 31 using only the IC chip 10 is designed based on the IC package 11 including the IC chips 10 and 20, the IC chip 20 not to be used is simply omitted. Accordingly, a method for manufacturing such an IC package 31 is the same as a method for manufacturing the IC package 11 shown in FIG. 7(a), except that the method for manufacturing the IC package 31 does not includes a step of installing the IC chip 20 in the package 11a. In accordance with such a manufacturing method, the IC package 31 shown in FIG. 7(b) is manufactured.

FIG. 8(a) illustrates an IC package 17 obtained by installing, in the package 11a by way of the wires 3 and 4, an IC chip 7 on which the circuit blocks 1 and 2 are provided. FIG. 8(b) illustrates an IC package 41 obtained by installing the IC chip 7 in the package 11a by way of the wires 4.

In the designing method, when the new IC package 41 using only the circuit block 2 is designed based on the IC package 17 (see FIG. 8(a)) using the circuit blocks 1 and 2, the wires 3 associated with the circuit block 1 not to be used is omitted. Accordingly, a method for manufacturing such an IC package 41 is the same as a method for manufacturing the IC package 17 shown in FIG. 8(a), except that the method for manufacturing the IC package 41 does not includes a step of carrying out wiring with respect to the circuit block 1 not to be used, i.e., does not include a step of connecting the IC chip 7 to terminals of the package 11a by way of the wires 3. In accordance with such a manufacturing method, the IC package 41 shown in FIG. 8(b) is manufactured.

The package 11a of the IC package 31 designed and manufactured in accordance with the above methods has a region 5 whose structure is the same as that of a region 5 of the package 11a of the original IC package 11. Similarly, the package 11a of the IC package 41 designed and manufactured in accordance with the above methods has a region 6' whose structure is the same as that of a region 6' of the original IC package 17. Each of the regions 5 is associated with the circuit block 1, and each of the regions 6' is associated with the circuit block 2. As such, the IC packages 31 and 41 designed and manufactured in accordance with the above methods have the same terminal layouts as those of the original IC packages, respectively. See the following specific example. That is, a single-band power amplifier provided by SHARP CORPORATION and described in p. 152 of Non-patent document 6 is designed based on a dual-band power amplifier provided by SHARP CORPORATION and described in p. 152 of Non-patent document 6, although this fact is not described therein. For this reason, the single-band power amplifier and the dual-band power amplifier have a common terminal layout.

Note that each of FIG. 5(a) through FIG. 5(c) and FIG. 6(a) through FIG. 6(c) illustrates one example of the IC package designed by the present inventors in accordance with each of the publicly know techniques, so that each of the figures does not illustrate the publicly known technique itself.

Non-patent document 1: ANADIGICS, Inc., "WLAN PAs" (brochure), [online], published on July 2004, [Accessed on Dec. 31, 2000], Internet <URL: http://www.anadigics.com/products/addrefs/Brochure/WL AN_Brochure_(07-2004)_web.pdf>

Non-Patent document 2: RF Integrated Corp., "AP2010 2.4 & 5 GHz Dual Band Power Amplifier Data Sheet", [online], published on Dec. 15, 2004 [Accessed on Jan. 12, 2005], Internet <URL: http://www.rfintc.com/pdf_file/AP2010.pdf>

Non-patent document 3: RF Integrated Corp., "AP1091 2.4 GHz Power Amplifier Data Sheet", [online], published on Mar. 27, 2003, [Accessed on Jan. 12, 2005], Internet <URL: http://www.rfintc.com/pdf_file/AP1091.pdf>

Non-patent document 4: RF Integrated Corp., "AP1093 2.4 GHz Power Amplifier Data Sheet", [online], published on Aug. 6, 2004, [Accessed on Jan. 12, 2005], Internet <URL: http://www.rfintc.com/pdf_file/AP1093.pdf>

Non-Patent document 5: RF Integrated Corp., "AP2085 5 GHz Power Amplifier Data Sheet", [online], published on Aug. 30, 2004 [Accessed on Jan. 12, 2005], Internet <URL: http://www.rfintc.com/pdf_file/AP2085.pdf>

Non-Patent document 6: "Basis of Wireless Data Communication and Utilization of RF Components" edited by Transistor Technique Editorial Department, CQ publishing. Co. Ltd., published on Dec. 1, 2003, p.p. 152-166.

In each of the conventional techniques explained with reference to FIG. 5(a) through FIG. 5(c) and FIG. 6(a) through FIG. 6(c), the package and the terminal layout of the IC package to be designed, i.e., the package and the terminal layout of the IC package merely using either the circuit block 1 or the circuit block 2 are determined in accordance with (i) the size of the IC chip (10 or 20) to be used, (ii) the number of the terminals, and (iii) the easiness in the wire layout. Accordingly, the package and the terminal layout of the designed IC package are changed from the package and the terminal layout of the original IC package, i.e., the IC package using the circuit blocks 1 and 2. Such a change in the package and the terminal layout generally causes a change of a property of the IC package. For example, see a case where each of the IC packages is a circuit for processing a high-frequency signal, such as a high-frequency wireless communication amplifier. In this case, the change in the layout of terminals (input terminal and output terminal) for transmitting the high-frequency signal causes a change of a property (e.g., amplification property) of the IC package. This possibly causes no problem in some cases, i.e., depending on a function of the circuit block to be used; however, in many cases, this requires changes of a pattern and peripheral elements each provided in a substrate in which the IC package using the circuit blocks 1 and 2 is installed. Specifically, the pattern and the peripheral elements in the substrate need to be changed so as to be accommodated to the IC package using either the circuit block 1 or the circuit block 2. For example, in cases where each of the circuit blocks 1 and 2 is an IC for processing a microwave-band high-frequency signal, the pattern and the peripheral circuit elements each provided in the substrate need to be changed so as to be accommodated to the IC package using either the circuit block 1 or the circuit block 2. Moreover, the pattern provided in the substrate in which the IC package using either the circuit block 1 or the circuit block 2 is installed serves as a part of the circuit in the case where each of the circuit blocks 1 and 2 is the IC for processing the microwave-band high-frequency signal, so that the change of the pattern provided in the substrate is not only a physical change of the wire pattern, but also a change of the circuit structure. This possibly requires a further adjustment.

This is specifically explained, e.g., as follows. In FIG. 5(a) through FIG. 5(c) and FIG. 6(a) through FIG. 6(c), assume that: the circuit block 1 is a 2.5 GHz band wireless LAN power amplifier for amplifying a high-frequency signal used in the 2.5 GHz band wireless LAN, and the circuit block 2 is a 5 GHz band wireless LAN power amplifier for amplifying a high-frequency signal used in the 5 GHz band wireless LAN. A glass epoxy substrate is used as the substrate on which the IC package is provided. Such a glass epoxy substrate is an insulative plate manufactured by impregnating a fiberglass fabric with an epoxy resin, and is frequently used in general as the substrate on which the IC package is provided. In such a substrate, the high-frequency signal used in the 2.5 GHz wireless LAN has an equivalent wavelength of approximately 6 cm, whereas the high-frequency signal used in the 5 GHz wireless LAN has an equivalent wavelength of approximately 3 cm. Each of the high-frequency signals having such equivalent wavelengths has such a phase that is considerably deviated by deviation of the wire. For example, when the wire is deviated by 4 mm so as to connect (i) the circuit block for processing the high-frequency signal used in the 5 GHz band wireless LAN to (ii) a peripheral component, the phase of the high-frequency signal is deviated by 45°. This causes respective changes of (i) the property of the IC package, and (ii) the property of the substrate in which the IC package is installed. Similarly, when an IC pattern of the IC chip is changed, the phase of the high frequency signal is deviated, with the result that the property of the IC package is changed. Further, the change of the IC pattern of such an IC chip for processing the high-frequency signal requires a great risk because the IC pattern needs to be determined in consideration of cross talk and radiation power each pertaining to such a high-frequency signal. For this reason, it is preferable that the IC pattern never be changed as much as possible once the IC pattern is determined in consideration of the cross talk and the radiation power each pertaining to such a high-frequency signal.

Such a problem is solved by the designing method explained with reference to FIG. 7(a), FIG. 7(b), FIG. 8(a) and FIG. 8(b) because the designing method requires no redesigning of the IC pattern.

However, the IC package designed in accordance with the designing method explained with reference to FIG. 7(a), FIG. 7(b), FIG. 8(a) and FIG. 8(b) merely needs the half of the circuit blocks, but requires a package area as large as that of the original IC package. For this reason, the designing method explained with reference to FIG. 7(a), FIG. 7(b), FIG. 8(a) and FIG. 8(b) is not suitable for designing of a small-size IC package. Moreover, each of the IC packages designed in accordance with the designing method has a package size larger than that of each of the IC package designed in accordance with the designing method explained with reference to FIG. 5(a) through FIG. 5(c), FIG. 6(a) through FIG. 6(c). This causes cost increase of the IC.

SUMMARY OF THE INVENTION

The present invention is made in light of the conventional problem, and its object is to provide (i) a method for designing, based on an IC package using a plurality of circuit blocks, an IC package having a part of the circuit blocks; and (ii) a method for manufacturing the IC package. The designing method never causes a property change requiring a great design change including a change of a pattern formed in a substrate in which the IC package is installed, but allows downsizing of the package. This makes it possible to design, in a short period of time, the IC package thus downsized.

To achieve the object, a method, according to the present invention, for designing a new IC package includes the step of: partially modifying an existing IC package having (i) a package in which a first circuit block and a second circuit block are provided, and (ii) a plurality of terminals which are connected to the first circuit block and the second circuit block, and which at least includes a high-frequency terminal that is connected to the first circuit block and that transmits a high frequency signal, in the step, a second circuit block being omitted from the existing IC package, in the step, at least a part of a portion, which is associated with the second circuit block, of the package constituting the existing IC package being omitted while maintaining a position of the high-frequency terminal connected to the first circuit block.

The above method makes it possible that the position of the high-frequency terminal connected to the first circuit block is never changed by the package modification, so that the property of the IC package is never changed due to the package modification. With this, no great design change including the change of the pattern formed in the substrate in which the IC package is installed is required for the purpose of compensating the change, due to the package modification, of the property of the IC package. Accordingly, time required for the designing can be shortened. Further, the IC package can be downsized by omitting at least a part of the portion, which is associated with the second circuit block, of the package.

A method, according to the present invention, for manufacturing an IC package includes the steps of: (A) designing an IC package in accordance with the above designing method; and (B) manufacturing the IC package in accordance with the design.

The above method makes it possible to (i) shorten the time required for the designing of the substrate and adjustment of the designing using the above IC, and (ii) provide the downsized IC chip.

In the present specification, the wording "high frequency" refers to a frequency of 200 MHz or higher. Also in the present specification, the wording "substantially rectangular shape" encompasses (1) a rectangle, and (2) a shape which is not the rectangle and which has an area as large as not less than 70% of the area of a minimal rectangle encompassing the shape.

Additional objects, features, and strengths of the present invention will be made clear by the description below. Further, the advantages of the present invention will be evident from the following explanation in reference to the drawings.

BRIEF DESCRIPTION OF THE DRAWINGS

Each of FIG. 1(a) through FIG. 1(c) is a diagram for explaining an IC package designing method according to Embodiment 1 of the present invention.

Each of FIG. 2(a) through FIG. 2(c) is a diagram for explaining an IC package designing method according to Embodiment 2 of the present invention.

Each of FIG. 5(a) through FIG. 5(c) is a diagram for explaining one example of a conventional IC package designing method. FIG. 5(a) is a plan view illustrating a structure of an original IC package. FIG. 5(b) and FIG. 5(c) are plan views illustrating structures of designed IC packages, respectively.

Each of FIG. 6(a) through FIG. 6(c) is a diagram for explaining another example of a conventional IC package designing method.

Each of FIG. 7(a) and FIG. 7(b) is a diagram for explaining still another example of a conventional IC package designing method. FIG. 7(a) is a plan view illustrating a structure of an original IC package. FIG. 7(b) is a plan view illustrating a structure of a designed IC package.

Each of FIG. 8(a) FIG. 8(b) is a plan view illustrating a structure of a designed IC package.

DESCRIPTION OF THE EMBODIMENTS

Embodiment 1

Figure 1:
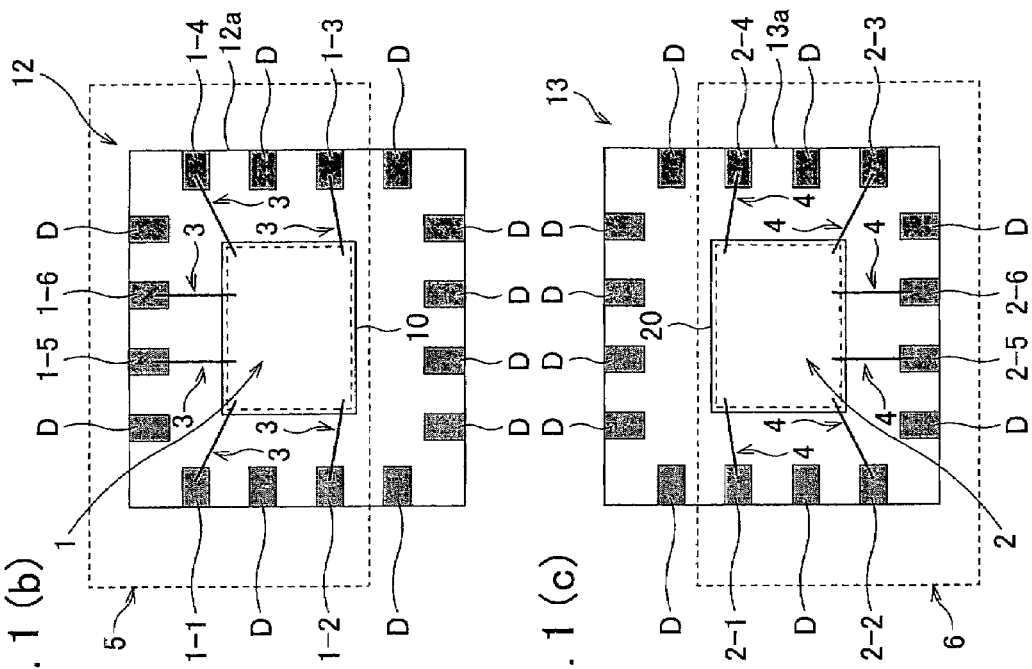
FIG. 1(a) is a plan view illustrating a structure of an original IC package.
FIG. 1(b) and FIG. 1(c) are plan views illustrating structures of designed IC packages, respectively.
Figure 1:
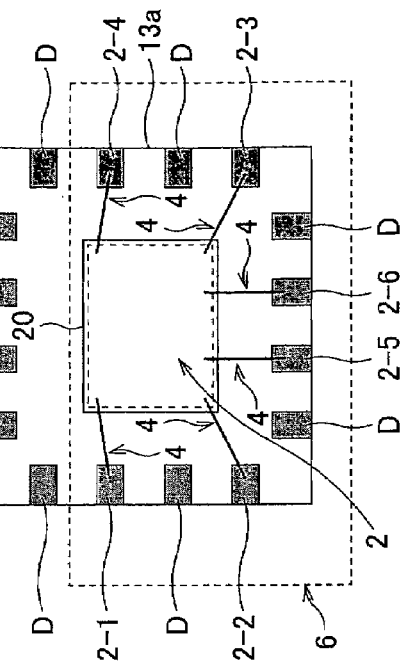
Figure 1:
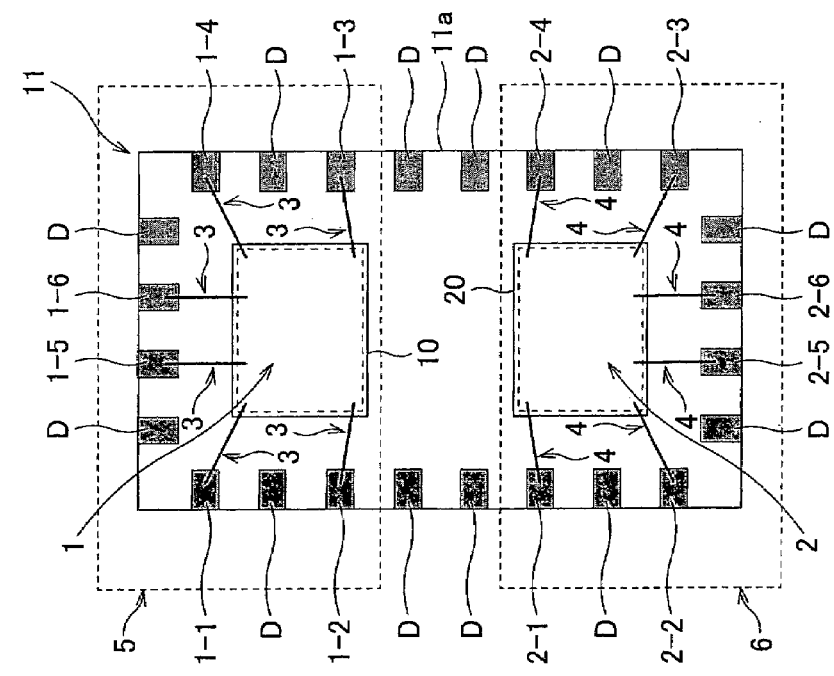

One embodiment of the present invention will be described below with reference to FIG. 1(a) through FIG. 1(c). For ease of explanation, materials having the equivalent functions as those shown in FIG. 5(a) through FIG. 8(b) will be given the same reference symbols, and explanation thereof will be omitted here. FIG. 1 correspond to FIG. 7(a) and FIG. 7(b).

A designing method of the present embodiment is a method for designing an IC package including only a circuit block 1 (see FIG. 1(a)), and an IC package including only a circuit block 2 (see FIG. 1(a)). The designing is carried out based on an IC package (original package) 11 including the circuit blocks 1 and 2.

As shown in FIG. 1(a), the IC package 11 is obtained by installing, in a package 11a, (i) an IC chip 10 having the circuit block 1 and (ii) an IC chip 20 having the circuit block 2. Each of the circuit blocks 1 and 2 is a circuit (high-frequency circuit) for processing a high-frequency signal, such as a circuit for amplifying the high-frequency signal. Typically, the circuit blocks 1 and 2 are formed by printing elements and wire patterns on semiconductor substrates (e.g., gallium arsenic substrates), respectively. Therefore, the circuit blocks 1 and 2 are provided on different chips (substrates).

Although not shown, the IC chip 10 has six terminals required for operation of the circuit block 1. Hereinafter, the terminals required for the operation of the circuit block 1 are referred to as terminals C1-1 through C1-6, respectively. Meanwhile, although not shown, the IC chip 20 has six terminals required for operation of the circuit block 2. Hereinafter, the terminals required for the operation of the circuit block 2 are referred to as terminals C2-1 through C2-6, respectively.

The package 11a has a rectangular shape having two short length sides and two long length sides. Provided on each of the short length sides of the package 11a are four terminals. Provided on each of the long length sides thereof are eight terminals. Therefore, the package 11a includes 24 terminals in total. Six of the 24 terminals of the package 11a are connected to the terminals C1-1 through C1-6 by way of wires 3, respectively. On the other hand, six of the 24 terminals of the package 11a are connected to the terminals C2-1 through C2-6 by way of wires 4, respectively. In explanation below and the figures, the six terminals connected to the terminals C1-1 through C1-6 of the IC chip 10 are respectively referred to as "terminals 1-1 through 1-6", and the six terminals connected to the terminals C2-1 through C2-6 are respectively referred to as "terminals 2-1 through 2-6". The other 12 terminals are referred to as "terminals D". Therefore, the terminals 1-1 through 1-6 of the package (package 11a, here) are necessary for the operation of the circuit block 1, and the terminals 2-1 through 2-6 thereof are necessary for the operation of the circuit block 2, and the terminals D thereof are not necessary for the operation of the circuit blocks 1 and 2. At least one of the terminals 1-1 through 1-6, and at least one of the terminals 2-1 through 2-6 are input terminals (high-frequency terminals) for receiving high-frequency signals, respectively. At least one of the terminals 1-1 through 1-6, and at least one of the terminals 2-1 through 2-6 are output terminals (high-frequency terminals) for sending high-frequency signals, respectively.

The designing method of the present embodiment is a method for designing a new IC package including the package 11a in which either the circuit block 1 or the circuit block 2 is provided. The designing is carried out by partially modifying the IC package (existing IC package) 11 including the package 11a in which the circuit blocks 1 and 2 are provided.

Now, see the case of designing, in accordance with the designing method of the present embodiment, a new IC package including the package 11a in which only the circuit block 1 is provided. In this case, the circuit block 2 is omitted from the IC package 11, and the respective positions of the terminals 1-1 through 1-6 connected to the circuit block 1 are never changed. Carried out thereafter is omission of a region (region substantially corresponding to a region 6), which is associated with the circuit block 2, of the package 11a constituting the IC package 11. More specifically, the size of the package 11a is reduced in the longitudinal direction (lengthwise direction of FIG. 1) such that a new package 12a is obtained, and the package 12a is adopted instead of the package 11a. The package 12a has a rectangular shape having four sides. Provided on each of the four sides are four terminals, so that the package 12a includes 16 terminals in total. Terminal layouts in three of the four sides of the package 12a are the same as the terminal layouts in the corresponding portions of the package 11a, respectively. Provided on the remaining one are the terminals D which are not necessary for the operation of the circuit block 1. In this way, an IC package 12 shown in FIG. 1(b) is designed. The IC package 12 shown in FIG. 1(b) is manufactured in accordance the design.

The IC package 12 thus designed and manufactured uses only the circuit block 1, and has the region 5 associated with the circuit block 1 and having the same terminal layout as that of the IC package 11 which uses the circuit blocks 1 and 2 and which is used as the design base. Therefore, the designed IC package 12 is the same as the IC package 11 in terms of a property associated with the circuit block 1. This requires no change of an IC pattern of the circuit block 1 to be used, and therefore requires no redesign and no re-adjustment each required when the IC pattern of the circuit block 1 is changed. Accordingly, time required for the designing and the adjustment is greatly shortened. Moreover, unlike the designing method according to FIG. 7(a) and FIG. 7(b), the IC package 12 using no circuit block 2 is designed by omitting the unnecessary part from the package 11a. This makes it possible to realize downsizing of the IC package. Further, the designing method of the present embodiment never requires a great design change including the change of the pattern formed in the substrate in which the IC package is installed. This is because the designing method of the present embodiment never causes the property change even when the package modification is carried out for the purpose of downsizing of the IC package, so that no compensation is required for the property change. Accordingly, time required for the designing and the adjustment is greatly shortened.

In the meanwhile, see the case of designing, in accordance with the designing method of the present embodiment, a new IC package including the package 11a in which only the circuit block 2 is provided. In this case, the circuit block 1 is omitted from the IC package 11, and the respective positions of the terminals 2-1 through 2-6 connected to the circuit block 2 are never changed. Carried out thereafter is omission of the region (region substantially corresponding to the region 5), which is associated with the circuit block 1, of the package 11a constituting the IC package 11. More specifically, the size of the package 11a is reduced in the longitudinal direction (lengthwise direction of FIG. 1) such that a new package 13a is obtained, and the package 13a is adopted instead of the package 1a. The package 13a has a rectangular shape having four sides. Provided on each of the four sides are four terminals, so that the package 13a includes 16 terminals in total. Terminal layouts in three of the four sides of the package 13a are the same as the terminal layouts in the corresponding portions of the package 11a, respectively. Provided on the remaining one are the terminals D which are not necessary for the operation of the circuit block 2. In this way, an IC package 13 shown in FIG. 1(c) is designed. The IC package 13 shown in FIG. 1(c) is manufactured in accordance the design.

The IC package 13 thus designed and manufactured uses only the circuit block 2, and has the region 6 associated with the circuit block 2 and having the same terminal layout as that of the IC package 11 which uses the circuit blocks 1 and 2 and which is used as the design base. Therefore, the designed IC package 13 is the same as the IC package 11 in terms of a property associated with the circuit block 2. This requires no change of an IC pattern of the circuit block 2 to be used, and therefore requires no redesign and no re-adjustment each required when the IC pattern of the circuit block 2 is changed. Accordingly, time required for the designing and the adjustment is greatly shortened. Moreover, unlike the designing method according to FIG. 7(a) and FIG. 7(b), the IC package 13 using no circuit block 1 is designed by omitting the unnecessary part from the package 11a. This makes it possible to realize downsizing of the IC package. Further, the designing method of the present embodiment never requires the great design change including the change of the pattern formed in the substrate in which the IC package is installed. This is because the designing method of the present embodiment never causes the property change even when the package modification is carried out for the purpose of downsizing of the IC package, so that no compensation is required for the property change. Accordingly, time required for the designing and the adjustment is greatly shortened.

Embodiment 2

Figure 2:
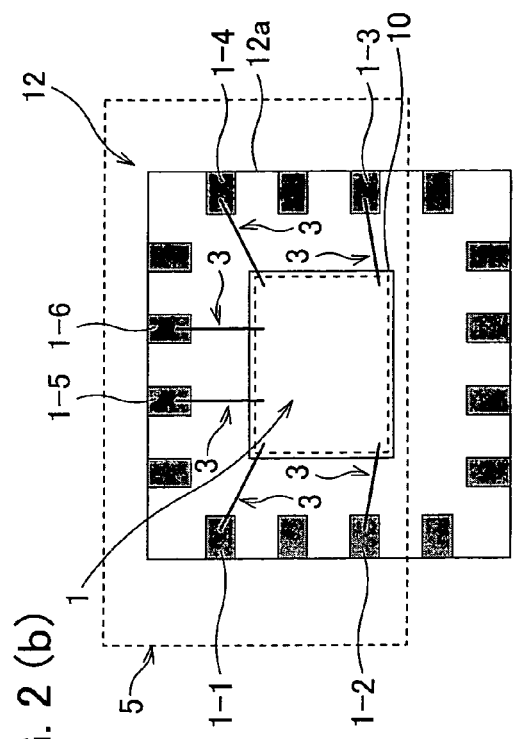
FIG. 2(a) is a plan view illustrating a structure of an original IC package.
FIG. 2(b) and FIG. 2(c) are plan views illustrating structures of designed IC packages, respectively.
Figure 2:
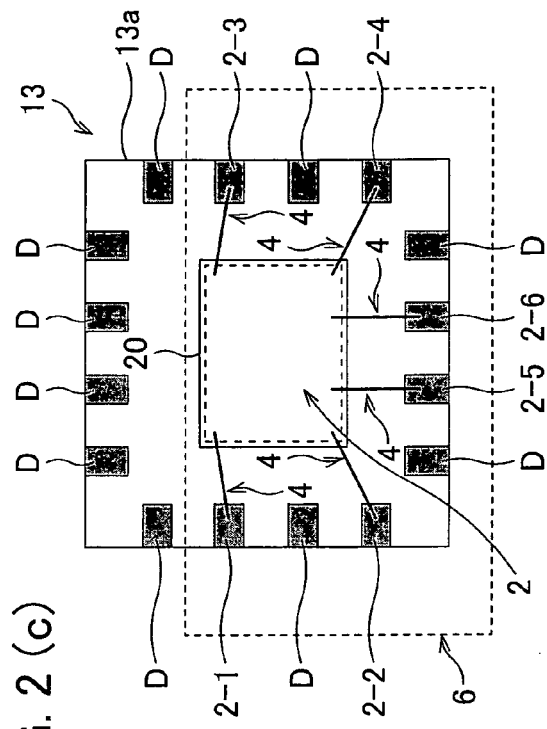
Figure 2:
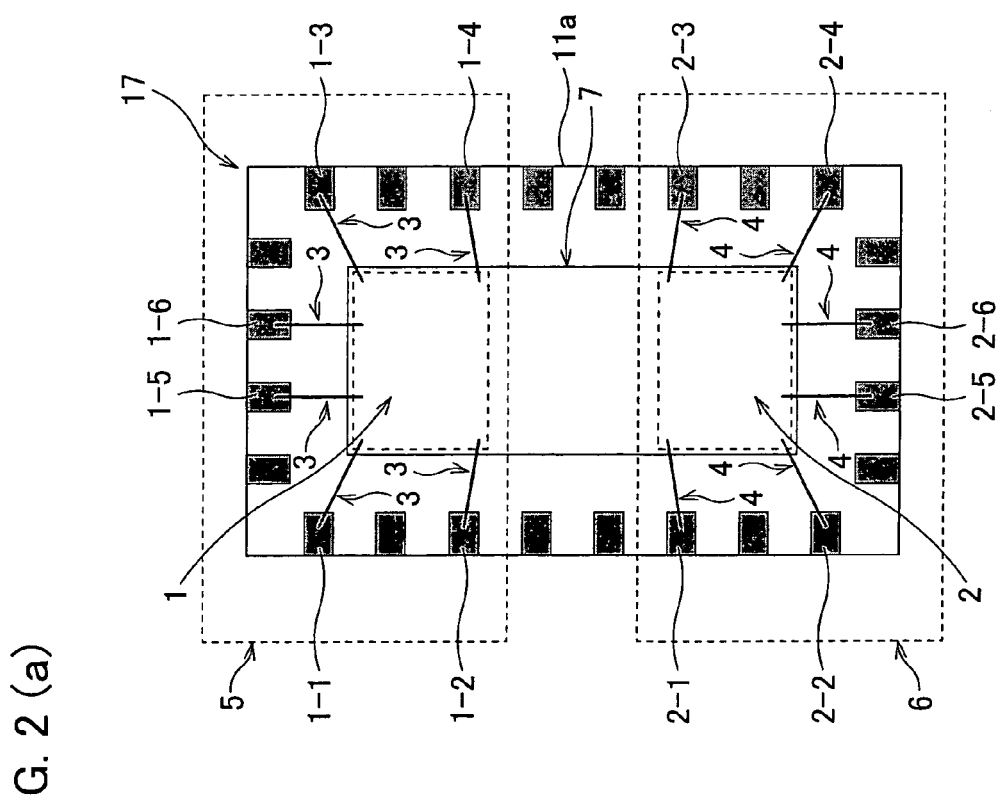

Another embodiment of the present invention will be described below with reference to FIG. 2(a) through FIG. 4. For ease of explanation, materials having the equivalent functions as those shown in the drawings pertaining to the foregoing First Embodiment will be given the same reference symbols, and explanation thereof will be omitted here. FIG. 2(a) through FIG. 2(c) corresponds to FIG. 8(a) and FIG. 8(b).

A designing method of the present embodiment is a method for designing an IC package including only the circuit block 1 (see FIG. 2(a)), and an IC package including only a circuit block 2 (see FIG. 2(a)). The designing is carried out based on an IC package (original IC package) 17 including the circuit block 1 and 2.

As shown in FIG. 2(a), the IC package 17 is obtained by installing, in a package 11a, an IC chip 8 in which the circuit blocks 1 and 2 are provided. In other words, the circuit blocks 1 and 2 are provided on the same chip (substrate).

The package 11a has the same structure as that of Embodiment 1.

The designing method of the present embodiment is a method for designing a new IC package including the package 11a in which either the circuit block 1 or the circuit block 2 is provided. The designing is carried out by partially modifying the IC package (existing IC package) 17 including the package 11a in which the circuit blocks 1 and 2 are provided.

Now, see the case of designing, in accordance with the designing method of the present embodiment, a new IC package including the package 11a in which only the circuit block 1 is provided. In this case, the circuit block 2 is omitted from the IC chip 7. In other words, the chip 10 including only the circuit block 1 is used instead of the chip 7. Further, the respective positions of the terminals 1-1 through 1-6 connected to the circuit block 1 are never changed. Carried out thereafter is omission of a region (region substantially corresponding to a region 6), which is associated with the circuit block 2, of the package 11a constituting the IC package 17. More specifically, a package 12a is adopted instead of the package 11a. In this way, an IC package 12 shown in FIG. 2(b) is designed. The IC package 12 shown in FIG. 2(b) is manufactured in accordance the design.

The IC package 12 thus designed and manufactured uses only the circuit block 1, and has the region 5 associated with the circuit block 1 and having the same terminal layout as that of the IC package 17 which uses the circuit blocks 1 and 2 and which is used as the design base. Therefore, the designed IC package 12 is the same as the IC package 17 in terms of a property associated with the circuit block 1. This requires no change of an IC pattern of the circuit block 1 to be used, and therefore requires no redesign and no re-adjustment each required when the IC pattern of the circuit block 1 is changed. Accordingly, time required for the designing and the adjustment is greatly shortened. Moreover, unlike the designing method according to FIG. 8(a) and FIG. 8(b), the IC package 12 using no circuit block 2 is designed by omitting the unnecessary part from the package 11a. This makes it possible to realize downsizing of the IC package. Further, the designing method of the present embodiment never requires a great design change including the change of the pattern formed in the substrate in which the IC package is installed. This is because the designing method of the present embodiment never causes the property change even when the package modification is carried out for the purpose of downsizing of the IC package, so that no compensation is required for the property change. Accordingly, time required for the designing and the adjustment is greatly shortened.

In the meanwhile, see the case of designing, in accordance with the designing method of the present embodiment, a new IC package including the package 11a in which only the circuit block 2 is provided. In this case, the circuit block 1 is omitted from the IC chip 7. In other words, an IC chip 20 including only the circuit block 2 is adopted instead of the chip 7. Moreover, the respective positions of the terminals 2-1 through 2-6 connected to the circuit block 2 are never changed. Carried out thereafter is omission of the region (region substantially corresponding to the region 5), which is associated with the circuit block 1, of the package 11a constituting the IC package 17. More specifically, a new package 13a is adopted instead of the package 11a. In this way, an IC package 13 shown in FIG. 2(c) is designed. The IC package 13 shown in FIG. 2(c) is manufactured in accordance the design.

The IC package 13 thus designed and manufactured uses only the circuit block 2, and has the region 6 associated with the circuit block 2 and having the same terminal layout as that of the IC package 17 which uses the circuit blocks 1 and 2 and which is used as the design base. Therefore, the designed IC package 13 is the same as the IC package 17 in terms of a property associated with the circuit block 2. This requires no change of an IC pattern of the circuit block 2 to be used, and therefore requires no redesign and no re-adjustment each required when the IC pattern of the circuit block 2 is changed. Accordingly, time required for the designing and the adjustment is greatly shortened. Moreover, unlike the designing method according to FIG. 8(a) and FIG. 8(b), the IC package 13 using no circuit block 1 is designed by omitting the unnecessary part from the package 11a. This makes it possible to realize downsizing of the IC package. Further, the designing method of the present embodiment never requires the great design change including the change of the pattern formed in the substrate in which the IC package is installed. This is because the designing method of the present embodiment never causes the property change even when the package modification is carried out for the purpose of downsizing of the IC package, so that no compensation is required for the property change. Accordingly, time required for the designing and the adjustment is greatly shortened.

For realization of the designing method and the manufacturing method of Embodiment 2 with ease, it is preferable to arrange the layout of the IC chip 7 such that the IC chip 10 can be obtained by simply omitting (leaving out) either the circuit block 1 or the circuit block 2 from the IC chip 7 upon the IC chip designing. Reason for this is as follows. That is, the pattern change is required for the omission of either the circuit block 1 or the circuit block 2 in, e.g., the following cases (1) and (2): (1) a case where the pattern of the circuit block 1 and the pattern of the circuit block 2 are crossed with each other, and (2) a case where the circuit block (1 or 2) not to be omitted has such an irregular shape that is involved with the circuit block to be omitted. Such a pattern change in the chip causes the change of the high-frequency property of such a high-frequency IC. Accordingly, the redesign and the re-adjustment are possibly required even when the present invention is applied such that the pin layout is not changed. For this reason, it is preferable to arrange the layout of the IC chip 7 such that no great IC pattern change is required when omitting the irrelevant circuit block.

This will be further explained with reference to FIG. 3 and FIG. 4.

Figure 3:
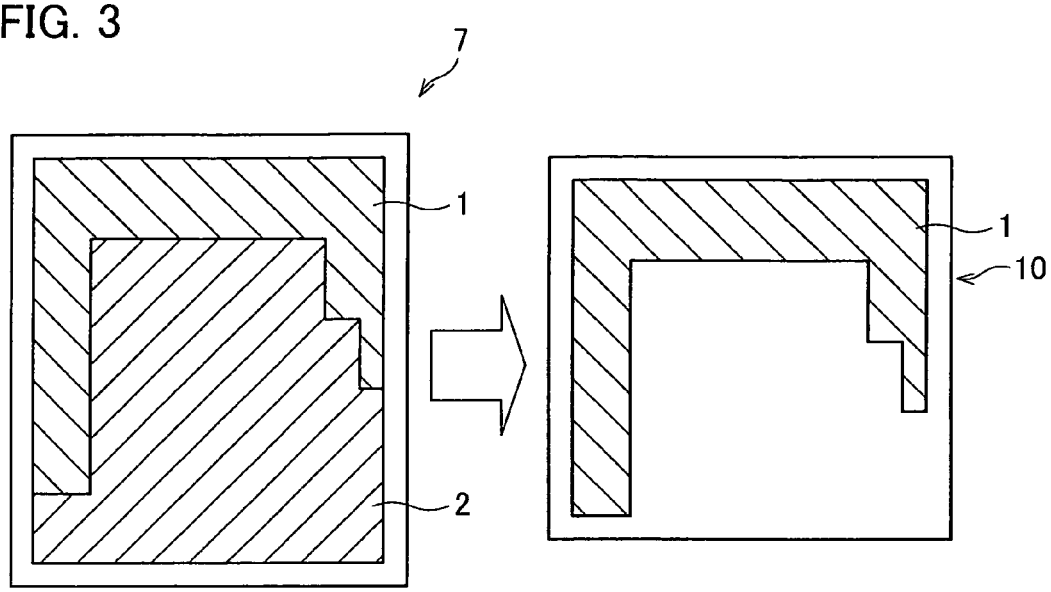
FIG. 3 is a diagram illustrating one example of changing a design of the IC chip in Embodiment 2 of the present invention.

See a case where the IC package 17 includes an IC chip 7 shown in FIG. 3 instead of the IC chip 7 shown in FIG. 2(a). In the IC chip 7 shown in FIG. 3, the IC pattern of the circuit block 1 is involved with the IC pattern of the circuit block 2. When designing an IC chip 10 by omitting the circuit block 2 from the IC chip 7, the IC chip 10 thus designed has an unused space in which no circuit is provided as shown in FIG. 3. In other words, a space is left unused in the substrate of the IC chip 10 of the IC package 12. This causes the size of the IC chip 10 to be large, with the result that the cost and the size of the IC package are increased. For elimination of such an unused space, modification of the IC chip 10 can be taken into consideration; however, such modification requires the great the IC pattern change. The circuit block 1 is such an IC whose operation frequency property is influenced by the IC pattern change, so that the IC pattern change requires not only an operation of changing the position of the IC pattern, but also another adjustment operation. For this reason, the IC pattern change cannot be easily carried out.

Figure 4:
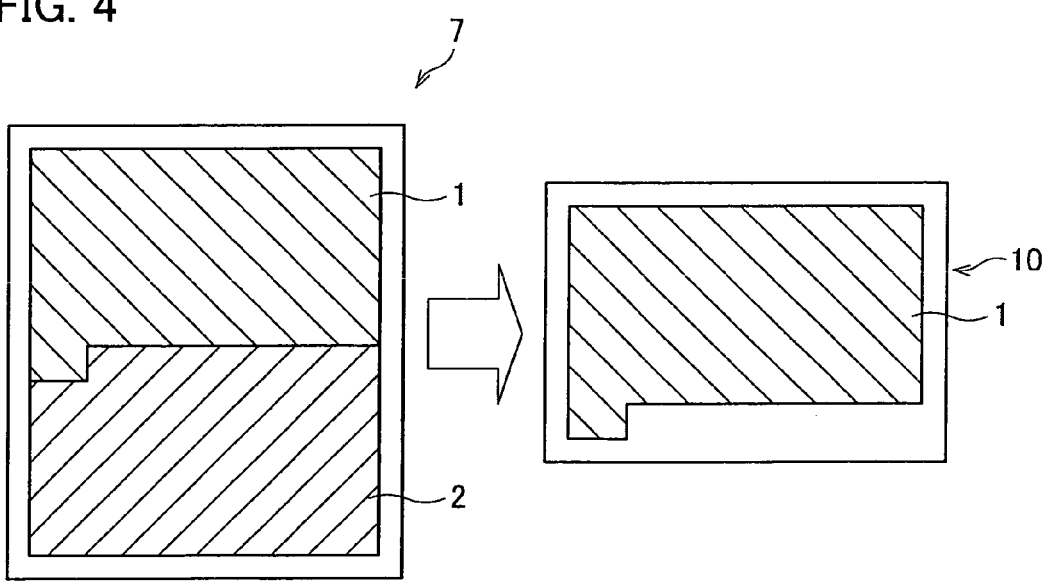
FIG. 4 is a diagram illustrating another example of changing a design of the IC chip in Embodiment_2 of the present invention.
Figure 6:
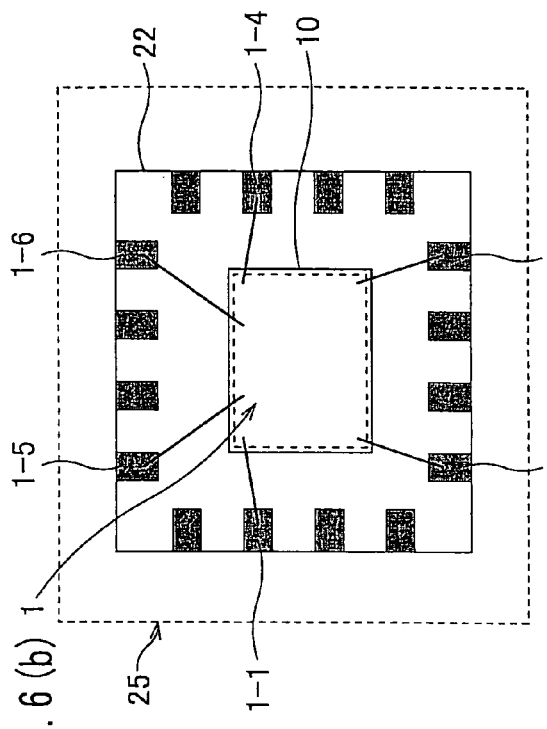
FIG. 6(a) is a plan view illustrating a structure of an original IC package.
FIG. 6(b) and FIG. 6(c) are plan views illustrating structures of designed IC packages, respectively.
Figure 6:
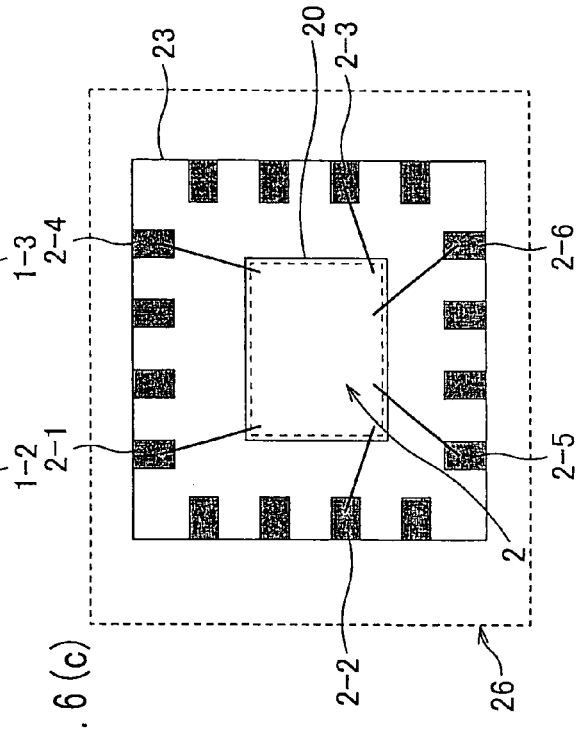
Figure 6:
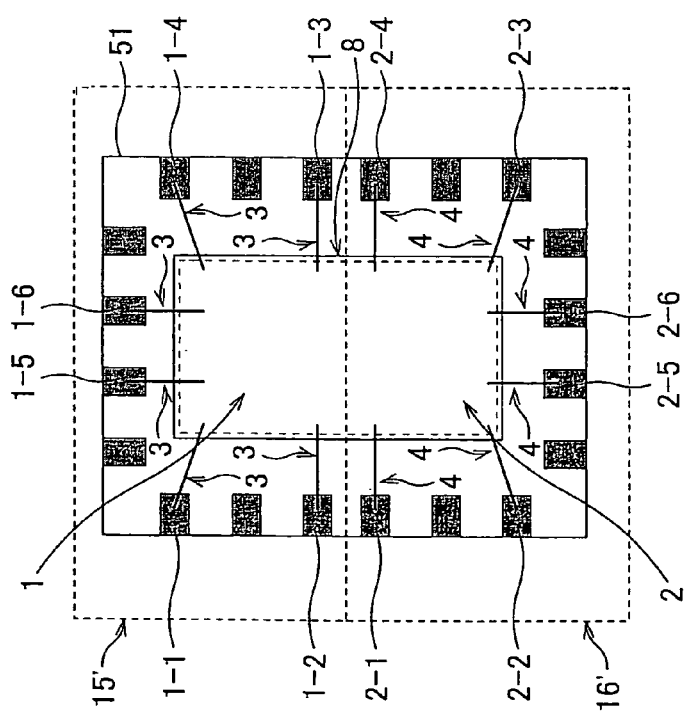
Figure 8:
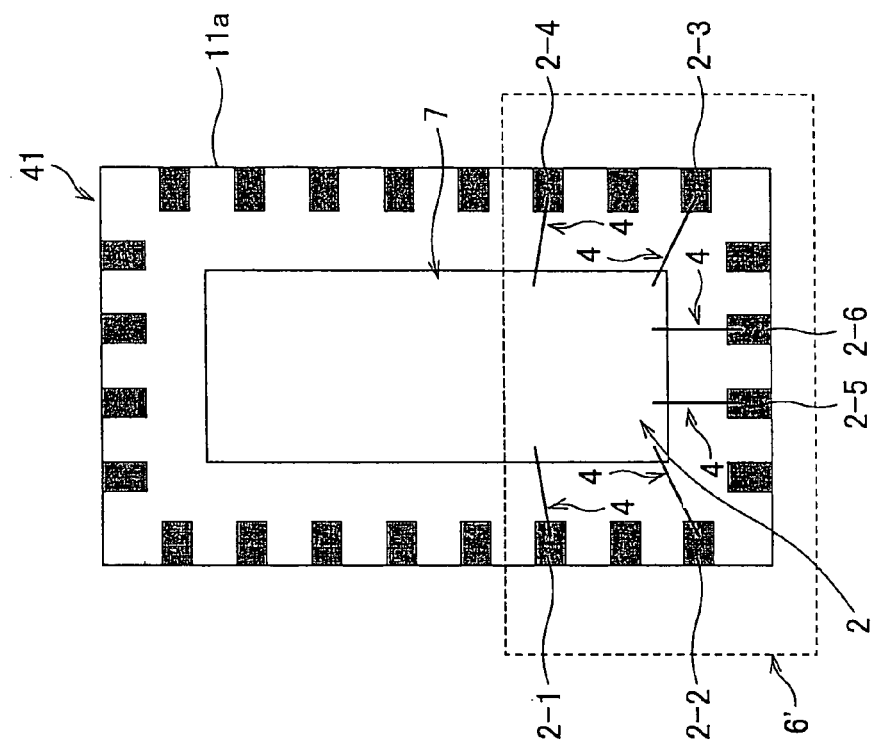
FIG. 8(b) is a diagram for explaining still another example of a conventional IC package designing method.
FIG. 8(a) is a plan view illustrating a structure of an original IC package.
Figure 8:
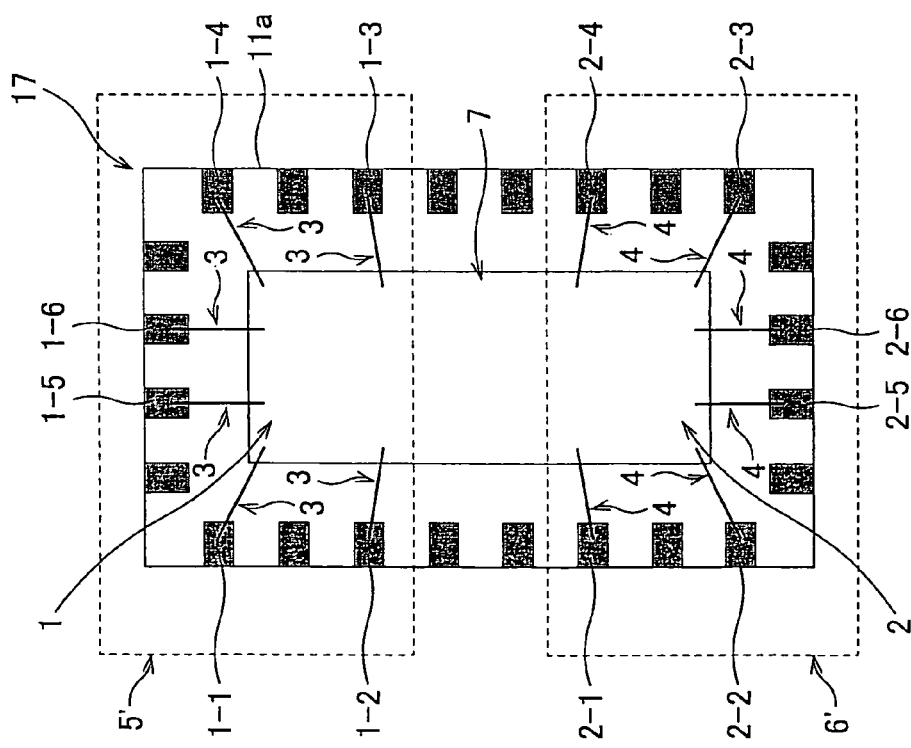

On the other hand, see a case where the IC package 17 includes an IC chip 7 shown in FIG. 4 instead of the IC chip 7 shown in FIG. 2(a). The IC chip 7 includes circuit blocks 1 and 2 each having a substantially rectangular shape. The wording "substantially rectangular shape" encompasses (1) a rectangle, and (2) a shape which is not the rectangle and which has an area as large as not less than 70% of the area of a minimal rectangle encompassing the shape. The IC chip 10 is designed by omitting the circuit block 2 from the IC chip 7, and the IC chip 10 thus designed has substantially no unused space in which no circuit is provided as shown in FIG. 4. Accordingly, the cost and the size of the IC package are never increased. Further, even when changing the IC pattern of the circuit block 1, substantially no modification is required, so that the IC pattern change can be easily carried out.

The IC package 7 (see FIG. 4) from which the irrelevant circuit block is omitted has a rectangular vacant space which extends one end to the other end of the IC package 7 and in which the irrelevant circuit block used to be provided.

For this reason, in the method for designing the IC package 12 based on the IC package 17, it is preferable to use such an IC package 17 that includes the IC chip 7 in which the circuit block 2 (second circuit block) to be omitted has a substantially rectangular shape and has no wire crossed with a wire of the circuit block 1 (first circuit block).

The present invention is made based on the following idea: "the change of the IC pattern of the IC chip possibly causes the change of the property of the IC chip, so that it is preferable that the IC pattern never be changed as much as possible in the method for designing the IC package including the high-frequency circuit". Therefore, the designing method of the present invention never requires the change of the IC pattern of the IC chip. This makes it possible to avoid such a risk that the change of the IC pattern causes the change of the property of the IC package.

Moreover, the designing method of the present invention is a method for designing an IC package based on an existing IC package. The designing method of the present invention makes it possible to avoid the design change causing the change of the property of the IC package. With this, the change of the IC pattern of the IC chip is not required so as to deal with the design change.

Avoided for the attainment of this is at least a change of the position of the high-frequency terminal whose position change practically influences the property of the IC package. Allowable therefor is a change of the respective positions of the terminals whose position change never practically influences the property of the IC package. Further, a change of the position of each of terminals through which a direct current flows never causes the change of the property of the IC package. In contrast, a change of the position of each of terminals through which an alternating current flows surely causes the change of the property of the IC package, in theory. However, in cases where the alternating current has a low frequency, the change of the property of the IC package can be ignored (cannot be observed). A correlation between the frequency of the alternating current and the change of the property of the IC package depends on degree of the change of the respective positions of the terminals, i.e., depends on an installation area of the terminals in the IC package. Specifically, when the frequency of the alternating current is relatively low but the respective positions of the terminals are greatly changed, the change of the property of the IC package cannot be ignored. However, generally speaking, such an unignorable change of the property occurs when the alternating current has a frequency of 200 MHz or greater, so that the change of the property can be ignored when the alternating current has a frequency of less than 200 MHz.

As described above, the property of the IC package is practically never influenced by the change of the respective positions of a terminal connected to ground, the terminals through which the direct current flows, and the terminals through which the alternating current that never has a high frequency of 200 MHz or greater flows (i.e., through which the alternating current having a frequency of less than 200 MHz flows). Further, the property of the IC package is not influenced at all by the change of the position of either the terminal connected to the ground, or each of the terminals through which the direct current flows. (The change of the position never causes the change of the property of the integrated circuit package, in theory.)

Each of the designing methods according to Embodiments 1 and 2 can be realized by changing the size of the package 11a used in the designing method explained with reference to FIG. 7(a), FIG. 7(b), FIG. 8(a), and FIG. 8(b). However, each of the designing methods according to Embodiments 1 and 2 cannot be realized by merely reducing the size of the package 11a in accordance with a general method.

This is explained specifically as follows. A package used in general is a QFN (Quad Flat Leadless Package; a package having four sides on which terminals are provided) having a quadrangular shape and shown in each of FIG. 1(a) through FIG. 2(c) and FIG. 5(a) through FIG. 8(b). Therefore, in cases where downsizing of the package 11a is carried out in accordance with the designing method explained with reference to FIG. 7(a), FIG. 7(b), FIG. 8(a), and FIG. 8(b), a quadrangular package smaller than the package 11a used as the design base is selected in general. However, the following problem arises in such a case, for example. Assume that: a QFN having a size of 4 mm×4 mm is used as the package 11a, and such a package 11a is downsized to a QFN having a size of 3 mm×3 mm. In this case, the longitudinal sides and the lateral sides of the package 11a are shortened, with the result that distance is changed between the terminals and the distance is changed between each terminal and the IC chip. Accordingly, the respective positions of the terminals 1-1 through 1-6 are changed. This possibly makes it impossible to contain the IC chip in the package thus downsized. For this reason, in a normal case, no downsizing is carried out and the QFN having a size of 4 mm×4 mm is used.

In contrast, the designing method of the present invention makes it possible that the size of the package 11a is changed such that the respective positions of the terminals 1-1 through 1-6 are not changed. Carried out for attainment of this in the designing method of the present invention is, e.g., shortening of either (i) each of the longitudinal sides or (ii) each of the lateral sides. For example, the package 11a, i.e., the QFN having a size of 4 mm×4 mm is downsized to a package 12a having a size of 4 mm×3 mm. In the manufacturing method of the present invention, such a package 12a designed by shortening either each of the longitudinal sides or each of the lateral sides of the package 11a is manufactured with the use of (i) a lead frame and (ii) a metal pattern for use in resin molding. As such, the manufacturing method of the present invention cannot be realized by merely using existing quadrangular QFN lineups (a commercially available QFN and a manufacturing apparatus).

As described above, the present invention is made to provide a small package which is designed based on an IC package including a plurality of circuit blocks, and which uses a part of the circuit blocks, and which has the same terminal layout as that of the original IC package. The present invention is made to realize downsizing of an IC package while securing pin-compatibility (the number of the pins (terminals) and the respective functions of the pins are the same between the original IC package and the downsized IC package). Therefore, the present invention provides such a method that: the package portion associated with the irrelevant circuit block are omitted from the IC package including the circuit blocks by omitting the irrelevant circuit block, and the original terminal layout is not changed in the required circuit block. This allows downsizing of the IC package while no pattern change in the portion to be used is required in designing (i) the substrate using the IC having the circuit blocks and (ii) the substrate using the IC including a part of the circuit blocks. This makes it possible to shorten time required for (i) the redesign for the downsizing, and (ii) the adjustment.

The present invention is not limited to the description of the embodiments above, but may be altered by a skilled person within the scope of the claims. An embodiment based on a proper combination of technical means disclosed in different embodiments is encompassed in the technical scope of the present invention.

For example, each of the aforementioned embodiments assumes the case where the original package includes two circuit blocks; however, the original package may include three circuit blocks or greater. In this case, an IC package including two circuit blocks or greater can be designed. Moreover, the shape of the package of the IC package, the shape of each of the circuit blocks, the terminal layout are not limited to the examples described in the aforementioned embodiments, but can be freely modified. Further, each of the aforementioned embodiments assumes the case where the wire-bonding method is used to install each circuit block, which serves as an IC chip, in the IC package; however, the method for installing the circuit block in the IC package is not particularly limited.

As described above, the IC package designing method according to the present invention makes it possible that: the property change, due to the package modification, of the IC package is avoided by omitting at least a part of a portion, which is associated with the second circuit block, of the package constituting the existing IC package, while maintaining a position of the high-frequency terminal connected to the first circuit block. Accordingly, the property change, due to the package modification, of the IC package is compensated. This requires no great design change including the change of the pattern formed in the substrate in which the IC package is installed, with the result that the time required for the designing is shortened. Further, the IC package can be downsized by the omission of at least the part of the portion, which is associated with the second circuit block, of the package. Accordingly, the IC package thus downsized can be designed in a short period of time.

The method according to the present invention may be arranged such that: the first circuit block and the second circuit block are provided on either different chips or an identical chip, in the existing IC package.

In cases where the first circuit block and the second circuit block are provided in the same chip in the existing IC package, it is preferable to arrange the method according to the present invention such that: the second circuit block of the existing integrated circuit package has a substantially rectangular shape, and has no wire crossed with a wire of the first circuit block.

This makes it possible to easily design the downsized IC package having a small unused space in which no circuit block is provided.

Further, the method of the present invention may be arranged such that: the existing integrated circuit package having the high-frequency terminal further includes either (i) a terminal connected to ground, or (ii) another terminal through which either an alternating current voltage having no high frequency or a direct current voltage is supplied; and the new integrated circuit is designed by changing a position of said another terminal.

This allows improvement of freedom in designing the terminal layout.

The present invention makes it possible for the user to shorten (i) the time required for the designing and (ii) the time required for the adjustment, so that the present invention is effective in designing and manufacturing various types of IC package. Further, the present invention makes it possible to provide a small IC package.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A method for designing a new integrated circuit package, comprising the step of: partially modifying an existing integrated circuit package having (i) a package in which a first circuit block and a second circuit block are provided, and (ii) a plurality of terminals which are connected to the first circuit block and the second circuit block, and which at least includes a high-frequency terminal that is connected to the first circuit block and that transmits a high frequency signal, in the step, a second circuit block being omitted from the existing integrated circuit package, in the step, at least a part of a portion, which is associated with the second circuit block, of the package constituting the existing integrated circuit package being omitted so as to downsize the package while maintaining a position of the high-frequency terminal connected to the first circuit block.

2. The method as set forth in claim 1, wherein:
the first circuit block and the second circuit block are provided on different chips, in the existing integrated circuit package.

3. The method as set forth in claim 1, wherein:
the first circuit block and the second circuit block are provided on an identical chip, in the existing integrated circuit package.

4. The method as set forth in claim 3, wherein:
the second circuit block of the existing integrated circuit package has a substantially rectangular shape, and has no wire crossed with a wire of the first circuit block.

5. The method as set forth in claim 1, wherein:
the existing integrated circuit package having the high-frequency terminal further includes either (i) a terminal connected to ground, or (ii) another terminal through which either an alternating current voltage having no high frequency or a direct current voltage is supplied; and the new integrated circuit is designed by changing a position of said another terminal.

6. The method as set forth in claim 1, wherein:

each of the first circuit block and the second circuit block is a circuit for amplifying the high-frequency signal.

7. A method for manufacturing an integration circuit package, comprising the steps of:

(A) designing a new integrated circuit package by partially modifying an existing integrated circuit package having (i) a package in which a first circuit block and a second circuit block are provided, and (ii) a plurality of terminals which are connected to the first circuit block and the second circuit block, and which at least includes a high-frequency terminal that is connected to the first circuit and that transmits a high frequency signal; and (B) manufacturing the integrated circuit package in accordance with the design, in said step (A), a second circuit block being omitted from the existing integrated circuit package, in said step (A), at least a part of a portion, which is associated with the second circuit block, of the package constituting the existing integrated circuit package being omitted while maintaining a position of the high-frequency terminal connected to the first circuit block.

8. The method as set forth in claim 1, further comprising the step of modifying a part of the existing integrated circuit package to design another new integrated circuit package, in the modification step, the first circuit block being omitted from the existing integrated circuit package, in the modification step, at least a part of a portion, which is associated with the first circuit block, of the package constituting the existing integrated circuit package being omitted while maintaining the position of the high frequency terminal connected to the second circuit block.

9. The method as set forth in claim 7, further comprising the steps of:

(C) modifying a part of the existing integrated circuit package to design another new integrated circuit package; and (D) manufacturing the other integrated circuit package based on the design, in step (C), the first circuit block being omitted from the existing integrated circuit package, in step (C), at least a part of a portion, which is associated with the first circuit block, of the package constituting the existing integrated circuit package being omitted while maintaining a position of the high frequency terminal connected to the second circuit block.

\* \* \* \* \*